US010007302B2

(12) United States Patent
Brown et al.

(10) Patent No.: US 10,007,302 B2
(45) Date of Patent: Jun. 26, 2018

(54) MAGNETIC RESONANCE IMAGING COMPATIBLE MOBILE COMPUTING DEVICE

(71) Applicant: NeoCoil, LLC, Pewaukee, WI (US)

(72) Inventors: Brian Brown, Wauwatosa, WI (US); Stephen G. Hushek, Wauwatosa, WI (US)

(73) Assignee: Neocoil, LLC, Pewaukee, WI (US)

( * ) Notice: Subject to any disclaimer, the term of this patent is extended or adjusted under 35 U.S.C. 154(b) by 0 days. days.

(21) Appl. No.: 15/432,389

(22) Filed: Feb. 14, 2017

(65) Prior Publication Data

US 2017/0235342 A1 Aug. 17, 2017

Related U.S. Application Data

(60) Provisional application No. 62/295,374, filed on Feb. 15, 2016.

(51) Int. Cl.
*G06F 1/16* (2006.01)
*G06F 1/18* (2006.01)
*G01R 33/54* (2006.01)

(52) U.S. Cl.
CPC ......... *G06F 1/1656* (2013.01); *G01R 33/546* (2013.01); *G06F 1/1637* (2013.01); *G06F 1/183* (2013.01)

(58) Field of Classification Search
CPC ...... G06F 1/1656; G06F 1/1637; G06F 1/183; G01R 33/546
USPC .......... 361/679.58, 649.46, 679.02, 714, 816
See application file for complete search history.

(56) References Cited

U.S. PATENT DOCUMENTS

| 5,684,340 | A | * | 11/1997 | Soler | H05K 9/0039 |
| | | | | | 307/91 |
| 6,122,167 | A | * | 9/2000 | Smith | G06F 1/182 |
| | | | | | 257/E23.088 |
| 6,143,418 | A | * | 11/2000 | Takamiya | H01B 1/02 |
| | | | | | 428/434 |
| 6,256,075 | B1 | * | 7/2001 | Yang | G06F 1/1601 |
| | | | | | 312/7.2 |
| 6,894,739 | B2 | * | 5/2005 | Sung | G02F 1/133308 |
| | | | | | 349/58 |

(Continued)

OTHER PUBLICATIONS

International Search Report and the Written Opinion of the International Searching Authority dated May 10, 2017; International Patent Application No. PCT/US2017/017803; International Filing Date Feb. 14, 2017—(21) pages.

*Primary Examiner* — Dimary Lopez Cruz
*Assistant Examiner* — Abhishek Rathod
(74) *Attorney, Agent, or Firm* — Boyle Fredrickson, SC

(57) ABSTRACT

A mobile computer suitable for use in an MRI environment is disclosed. The mobile computer includes at least one shielded cavity in which the electronics for the mobile computer are inserted. The shielded cavity inhibits undesirable emissions from the mobile computer from affecting the quality of the image obtained by the MRI scanner and inhibits electrical interference generated by the dynamic magnetic fields in the MRI scanner from affecting the performance of the mobile computer. In addition, the components used in the mobile computer are selected from non-ferrous materials and are arranged in a manner to minimize interaction between the mobile computer and the MRI scanner.

19 Claims, 9 Drawing Sheets

(56) References Cited

U.S. PATENT DOCUMENTS

| | | | |
|---|---|---|---|
| 7,259,958 B2* | 8/2007 | Bang | H05K 5/0204 248/220.21 |
| 7,491,899 B2* | 2/2009 | Zuehlsdorf | H04B 1/40 174/372 |
| 7,492,609 B2* | 2/2009 | Wang | G02F 1/133308 361/816 |
| 7,508,655 B2* | 3/2009 | Baek | G02F 1/133308 248/917 |
| 7,609,531 B2* | 10/2009 | Xia | H05K 9/0054 174/350 |
| 7,903,431 B2* | 3/2011 | English | H05K 9/0032 174/382 |
| 7,969,720 B2* | 6/2011 | Zhang | G06F 1/1601 361/679.02 |
| 8,205,744 B1 | 6/2012 | Tashjian | |
| 8,629,355 B2* | 1/2014 | Kwon | H04B 15/04 174/354 |
| 8,859,913 B2 | 10/2014 | Judy | |
| 8,885,333 B2* | 11/2014 | Lim | H04M 1/185 345/204 |
| 9,244,139 B2 | 1/2016 | Brown et al. | |
| 2002/0078291 A1* | 6/2002 | Sutton | B60R 11/0252 710/302 |
| 2002/0144032 A1* | 10/2002 | Kriege | G06F 1/1616 710/62 |
| 2002/0154474 A1* | 10/2002 | Merz | G02F 1/133308 361/679.55 |
| 2005/0162056 A1* | 7/2005 | Lee | H01J 9/205 313/112 |
| 2007/0182298 A1* | 8/2007 | Kubota | H01J 11/44 313/110 |
| 2008/0200796 A1 | 8/2008 | Graham et al. | |
| 2009/0257207 A1* | 10/2009 | Wang | G06F 1/1626 361/752 |
| 2011/0149545 A1* | 6/2011 | Shiroishi | G06F 1/1616 361/816 |
| 2013/0039021 A1* | 2/2013 | Liu | G02F 1/133308 361/748 |
| 2014/0177181 A1* | 6/2014 | Malek | H05K 9/003 361/749 |
| 2014/0284503 A1 | 9/2014 | Stevick et al. | |
| 2015/0264842 A1 | 9/2015 | Song et al. | |
| 2015/0346778 A1* | 12/2015 | Yang | H04M 1/0202 361/679.3 |
| 2016/0042202 A1 | 2/2016 | Murray et al. | |

* cited by examiner

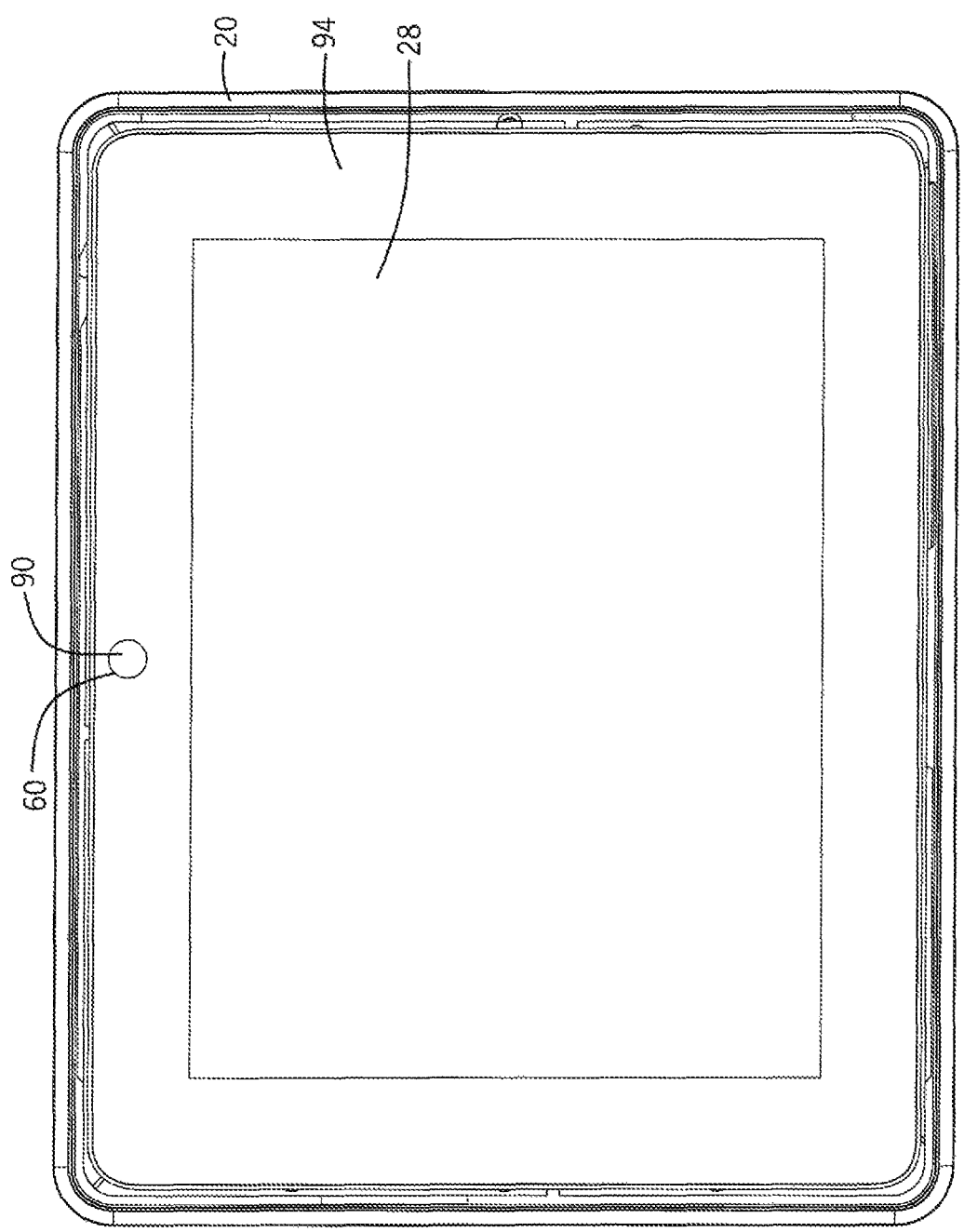

MAGNETIC RESONANCE IMAGING COMPATIBLE MOBILE COMPUTING DEVICE

CROSS-REFERENCE TO RELATED APPLICATIONS

This application claims priority to U.S. Provisional Application Ser. No. 62/295,374, filed Feb. 15, 2016 and titled Magnetic Resonance Imaging Compatible Mobile Computing Device, the entire contents of which is incorporated herein by reference.

BACKGROUND OF THE INVENTION

The subject matter disclosed herein relates to magnetic resonance imaging (MRI) "compatible" or "conditional" mobile computing devices. More specifically, tablet computers suitable for use by a patient or technologist in a MRI environment are disclosed.

As is known to those skilled in the art, an MRI system generates a strong magnetic field and detects the faint nuclear magnetic resonance (NMR) signals given off by nuclei in the presence of the magnetic field. The NMR signals are received by antennas, also known as coils, and transmitted to the MRI scanner for reconstruction into an MRI image. In order to provide a clear image, it is desirable to minimize electromagnetic interference from outside sources.

As a result, MRI scanners are located within a shielded room, also known as the scan room. The scan room includes walls, or panels, which typically incorporate radio frequency (RF) shielding within the wall. The controller for the MRI scanner is typically located in an adjacent control room. A window permits an operator to observe activity within the scan room from the adjacent control room.

However, the MRI environment creates numerous challenges that make conventional electronic devices unusable in the MRI environment. Most electronic devices employ magnetic parts or utilize ferrous components that are susceptible to the scanner's static magnetic field. The static magnetic field generated by the MRI scanner may, at a minimum, interfere with these devices, and at worst, pull the devices into the bore of the scanner, potentially injuring the patient. Further, non-magnetic metal components may be susceptible to electromagnetic interference once exposed to the MRI's strong dynamic magnetic fields, causing the device to malfunction or even destroying it. The electronic device itself could also interfere with the sensitive MRI imaging. For example, long wire runs typically connecting electrical controllers in the control room with audio-visual devices in the scan room may function as antennas. These long wire runs raise the potential of both radiating electromagnetic interference detectable by the MRI scanner due to signals transmitted on the wire and receiving interference from the MRI scanner which degrades the signal provided to the patient.

There is a desire to place electronic devices within the MRI environment for many reasons. One example of such need is during functional MRI (fMRI) scanning. In fMRI scanning, images must be taken of the brain while the brain is stimulated and unstimulated. Different types of stimulus are typically measured including visual stimuli in the form of images or videos shown to the patient and auditory stimuli such as audible sounds. However, delivering audio-visual stimuli to the patient has been a challenge in the MRI environment without electronic devices. Other uses of electronic devices within the MRI environment may include viewing the patient's facial responses, viewing real-time MRI waveforms and adjusting the scan prescription, patient charting, and audio-visual displays for patient comfort and entertainment (this is particularly useful for children and patients with claustrophobia), all from within the scan room.

Historically, these limitations have been overcome by removing electrical devices from the scan room completely or by removing electronic components from the scan room. One such solution for delivering audio-visual signals to the MRI environment is the use of fiber optic cables running between the control room and displays within the MRI environment. Other solutions include projection technology to project an image from the control room into the scan room, often with the assistance of mirrors and projection screens. However, the visual monitors are normally installed outside the bore and are difficult for the patient to see, providing a less than ideal solution. Audio solutions have included the use of pneumatic headphones, which eliminate any electronic components but compromise the quality of the sound.

SUMMARY OF THE INVENTION

The present invention provides a MRI "compatible" or "conditional" mobile computer. "MRI compatible" means that the device, when used in the MRI environment, will present no additional risk to the patient, will not significantly affect the quality of the diagnostic information, and will not be significantly affected by being in the MRI environment. "MRI conditional" means that the device has been demonstrated to pose no known hazard in a specified MRI environment with specified conditions of use. Field conditions that define the MRI environment include, for instance, the strength of the magnetic field, a static magnetic field, or a specific absorption rate (SAR). The tablet provides a substantially ferromagnetic-free or reduced ferromagnetic content device (where there are zero to minimal adverse effects for the specified conditions) with electromagnetic shielding and filters reducing or eliminating the transmission of electromagnetic signals into or out of the device. The mobile computer includes at least one shielded cavity in which the electronics for the mobile computer are inserted. The shielded cavity inhibits undesirable emissions from the mobile computer from affecting the quality of the image obtained by the MRI scanner and inhibits electrical interference generated by the switching gradients in the MRI scanner from affecting the performance of the mobile computer. In addition, the components used in the mobile computer are selected from non-ferrous materials and are arranged in a manner to minimize interaction between the mobile computer and the MRI scanner.

According to one embodiment of the invention, a mobile computer for use in a Magnetic Resonance imaging (MRI) environment during a MRI scan is disclosed. The mobile computer includes a housing having an opening, a display visible through the opening in the housing, a user interface operative to generate a signal corresponding to a desired operation of the mobile computer, and a printed circuit board. The printed circuit board includes a memory device and a processor in communication with the memory device, and the processor receives the signal from the user interface. The mobile computer also includes at least one shielded cavity within the housing, where the shielded cavity includes a first non-ferrous, conductive surface having a first outer periphery and a second non-ferrous, conductive surface having a second outer periphery. The first and the second non-ferrous conductive surfaces operatively engage each other to define the shielded cavity between the first and the second non-ferrous conductive surfaces. The printed circuit board and the display are located within the at least one shielded cavity.

According to another aspect of the invention, the at least one shielded cavity may include a first shielded cavity and a second shielded cavity, where the printed circuit board is located in the first shielded cavity, and the display is located in the second shielded cavity. The housing may include a front and rear cover, where the rear cover includes the first non-ferrous, conductive surface of the first shielded cavity.

According to yet another aspect of the invention, the mobile computer may also include a plate having a first metallic surface, and the printed circuit board may be mounted to the first metallic surface of the plate. The plate is mounted within the housing such that the first metallic surface of the plate faces the rear cover, and the second non-ferrous, conductive surface of the first shielded cavity is the first metallic surface of the plate. The plate may have a second metallic surface opposite the first metallic surface, and the display may be mounted adjacent to the second metallic surface of the plate. The mobile computer may include a display shield configured to be positioned over a viewing surface of the display, where the display shield includes a conductive material disposed therein and extends over the viewing surface of the display. The first non-ferrous, conductive surface of the second shielded cavity is defined by the second metallic surface of the plate, and the second non-ferrous, conductive surface of the second shielded cavity is defined by the conductive material of the display shield.

According to still other aspects of the invention, the plate may include a recess in which the display is positioned. A conductive material may be disposed around a periphery of the display such that the conductive material extends between the second metallic surface of the plate and the conductive material of the display shield. The user interface may be a touchscreen interface positioned on the display outside of the at least one shielded cavity, and a shielded cable may extend between the user interface and the printed circuit board in the at least one shielded cavity. A conductive film may be positioned over the touchscreen interface, where an outer periphery of the conductive film is in contact with an outer periphery of the conductive material of the display shield defining a third shielded cavity around the touchscreen interface. An antenna may be mounted within the housing external to the at least one shielded cavity, and a shielded cable may extend between the antenna and the printed circuit board in the at least one shielded cavity. A battery pack may be located within the shielded cavity, where the battery pack includes multiple batteries.

According to another embodiment of the invention, a mobile computer for use in a Magnetic Resonance Imaging (MRI) environment during a MRI scan is disclosed. The mobile computer includes a housing having an opening, a display visible through the opening in the housing, a printed circuit board including a memory device and a processor in communication with the memory device, a first shielded cavity, and a second shielded cavity. The first shielded cavity includes a first and second non-ferrous conductive surface, and the first shielded cavity is defined by a volume contained between the first and the second non-ferrous conductive surfaces. The printed circuit board is mounted within the first shielded cavity. The second shielded cavity includes a third and fourth non-ferrous conductive surface, and the second shielded cavity is defined by a volume contained between the third and the fourth non-ferrous conductive surfaces. The display is mounted within the second shielded cavity.

According to another aspect of the invention, the mobile computer may include a first or a second conductive gasket. The first conductive gasket may be positioned between the first non-ferrous conductive surface and the second non-ferrous conductive surface, and the first shielded cavity is defined by the volume contained between the first non-ferrous conductive surface, the second non-ferrous conductive surface, and the first conductive gasket. The second conductive gasket may be positioned between the third non-ferrous conductive surface and the fourth non-ferrous conductive surface, and the second shielded cavity is defined by the volume contained between the third non-ferrous conductive surface, the fourth non-ferrous conductive surface, and the second conductive gasket. Optionally, the second non-ferrous conductive surface may be the same as the third non-ferrous conductive surface.

According to still another aspect of the invention, the mobile computer may include a plate inserted within the housing. The plate includes a first conductive surface and a second conductive surface, where the second conductive surface is opposite the first conductive surface. The first conductive surface of the plate defines the second non-ferrous conductive surface, and the second conductive surface of the plate defines the third non-ferrous conductive surface.

According to still another embodiment of the invention, a mobile computer for use in a Magnetic Resonance Imaging (MRI) environment during a MRI scan is disclosed. The mobile computer includes a housing having an opening, a display visible through the opening in the housing, a user interface operative to generate a signal corresponding to a desired operation of the mobile computer, a printed circuit board including a memory device and a processor in communication with the memory device, where the processor receives the signal from the user interface, a means for preventing interference between an MRI scanner conducting the MRI scan and the display, and a means for preventing interference between the MRI scanner and the printed circuit board. The user interface may be a touchscreen interface, and the mobile computer may also include a means for preventing interference between the MRI scanner and the touchscreen interface.

BRIEF DESCRIPTION OF THE DRAWINGS

Various exemplary embodiments of the subject matter disclosed herein are illustrated in the accompanying drawings in which like reference numerals represent like parts throughout, and in which:

FIG. 9 is a top plan view of a touch screen interface installed over the frame of FIG. 8.

Figure 1:
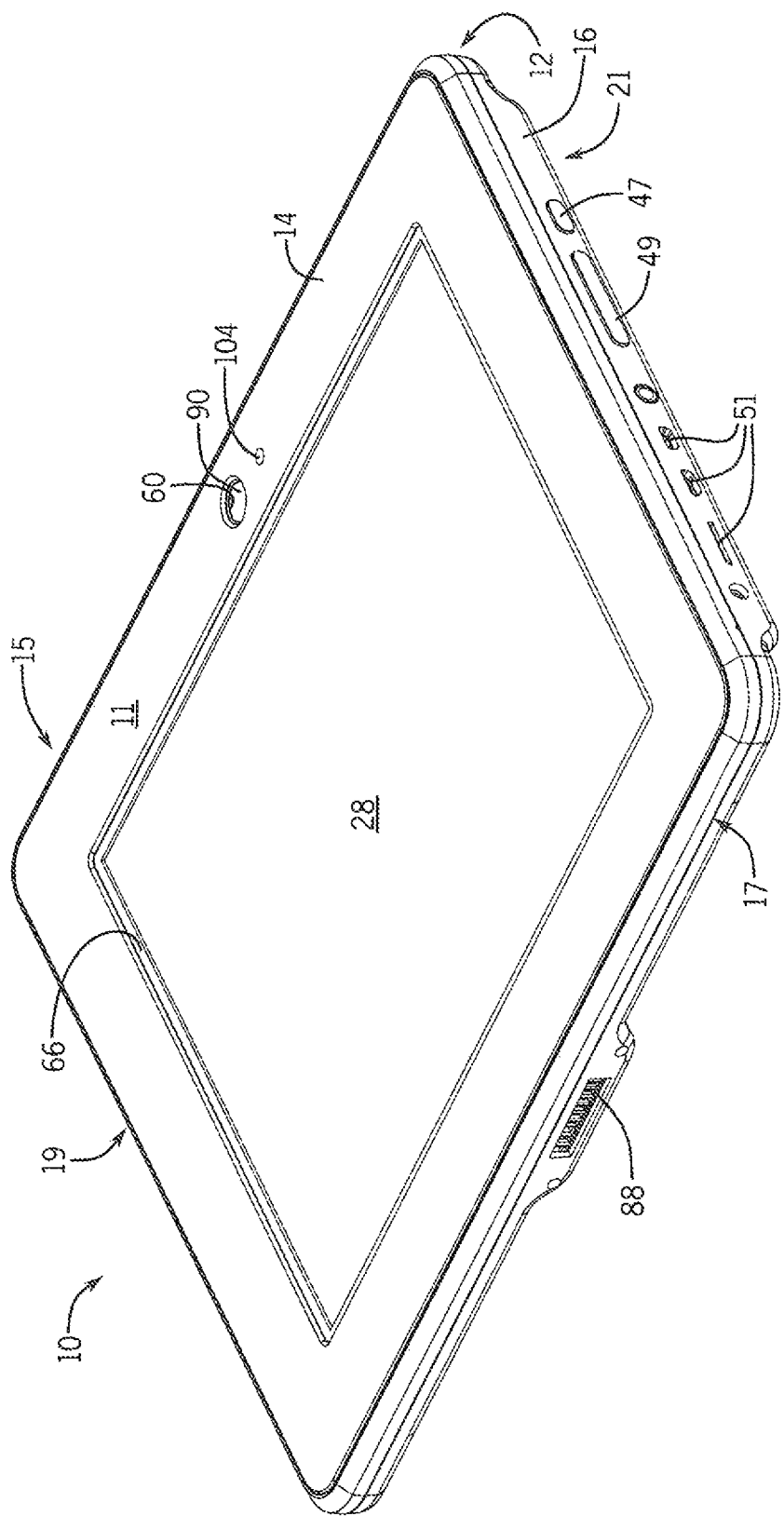
FIG. 1 is a perspective view of a tablet according to one embodiment of the present invention viewed generally from above the tablet.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION OF THE PREFERRED EMBODIMENTS

The various features and advantageous details of the subject matter disclosed herein are explained more fully with reference to the non-limiting embodiments described in detail in the following description.

Figure 2:
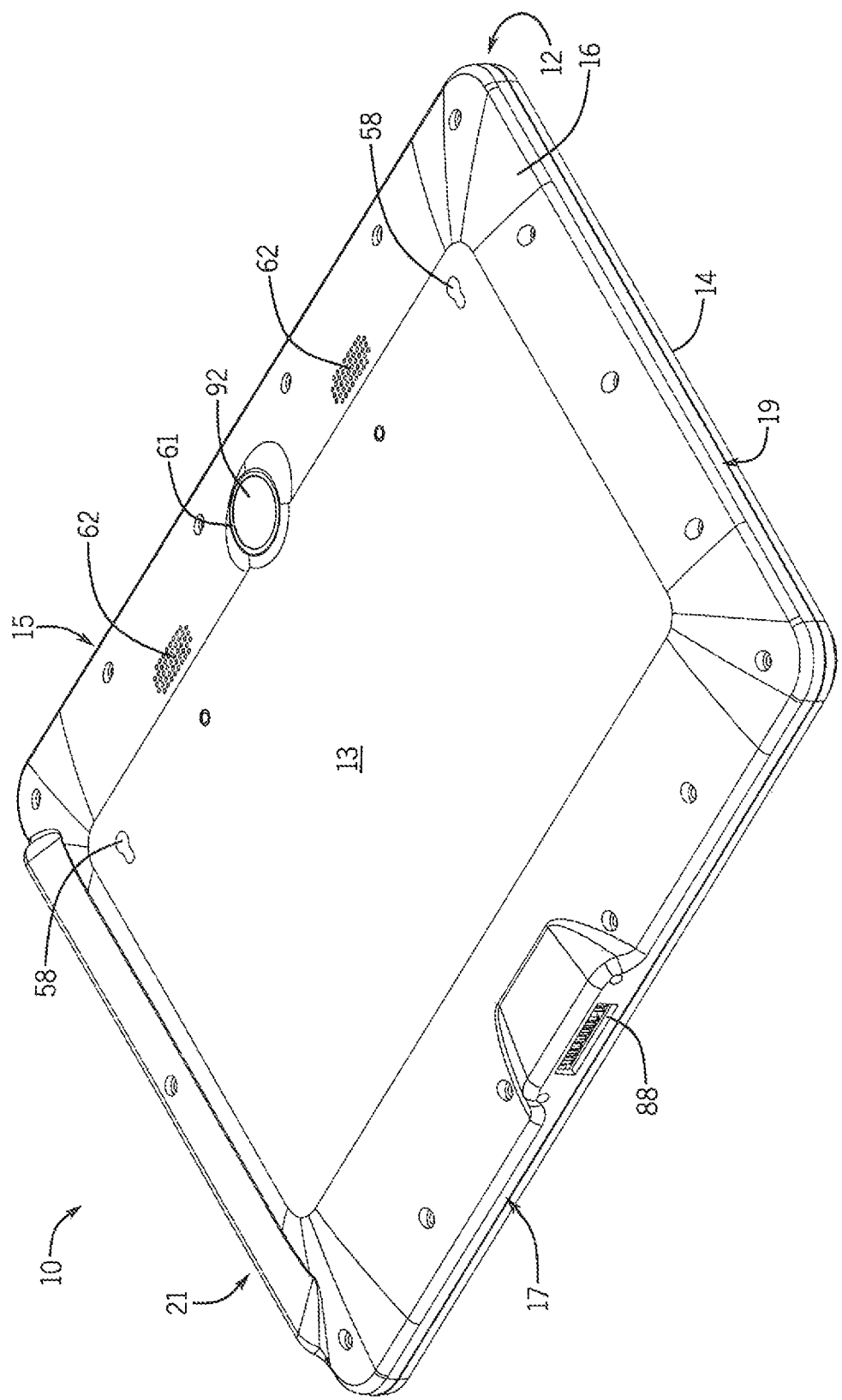
FIG. 2 is a perspective view of the tablet of FIG. 1 viewed generally from below the tablet.

Referring to FIGS. 1 and 2, one embodiment of a mobile computer, shown as a tablet computer 10, is illustrated. While the embodiment shown is a tablet computer 10, it is understood that the invention described herein may be applied to any wireless mobile computing device such as a laptop or mobile phone. According to the illustrated embodiment, the tablet computer 10 includes a front surface 11 and a rear surface 13 opposite the front surface 11. The tablet computer 10 further includes a top side 15 and a bottom side 17 opposite the top side 15. The tablet computer 10 also includes a left side 19 and a right side 21 opposite the left side 19. The use of the terms front, rear, top, bottom, left, or right are not intended to be limiting with respect to the location of any component described herein. Rather, the terms are utilized with respect to the illustrated embodiment to provide a relational description of the tablet 10 and for ease of description. It is understood that various other terms such as upper or lower and the like may be utilized and various configurations and arrangements of the components may be utilized without deviating from the scope of the invention.

The tablet computer 10 may be provided with varying hardware options and configurations, including, but not limited to, options such as a display, a user interface, a camera, a microphone, speakers, various ports for connectivity, and the like. According to the illustrated embodiment, the tablet computer 10 includes a touchscreen interface 28 and an LCD display panel 22. The tablet computer 10 also includes a first camera 90 located on the front surface 11 and a second camera 92 located on the rear surface 13. A microphone 104 is included on the front surface 11. Speakers 62 are located proximate speaker holes, or a speaker grille, 62 on the rear surface 13 of the tablet 10. Physical buttons 47, 49 may allow the user to adjust basic features such as speaker volume and power, and ports 51, 88 allow for network communications and battery charging. The specific features of the tablet computer 10 will be discussed in further detail below.

Figure 4:
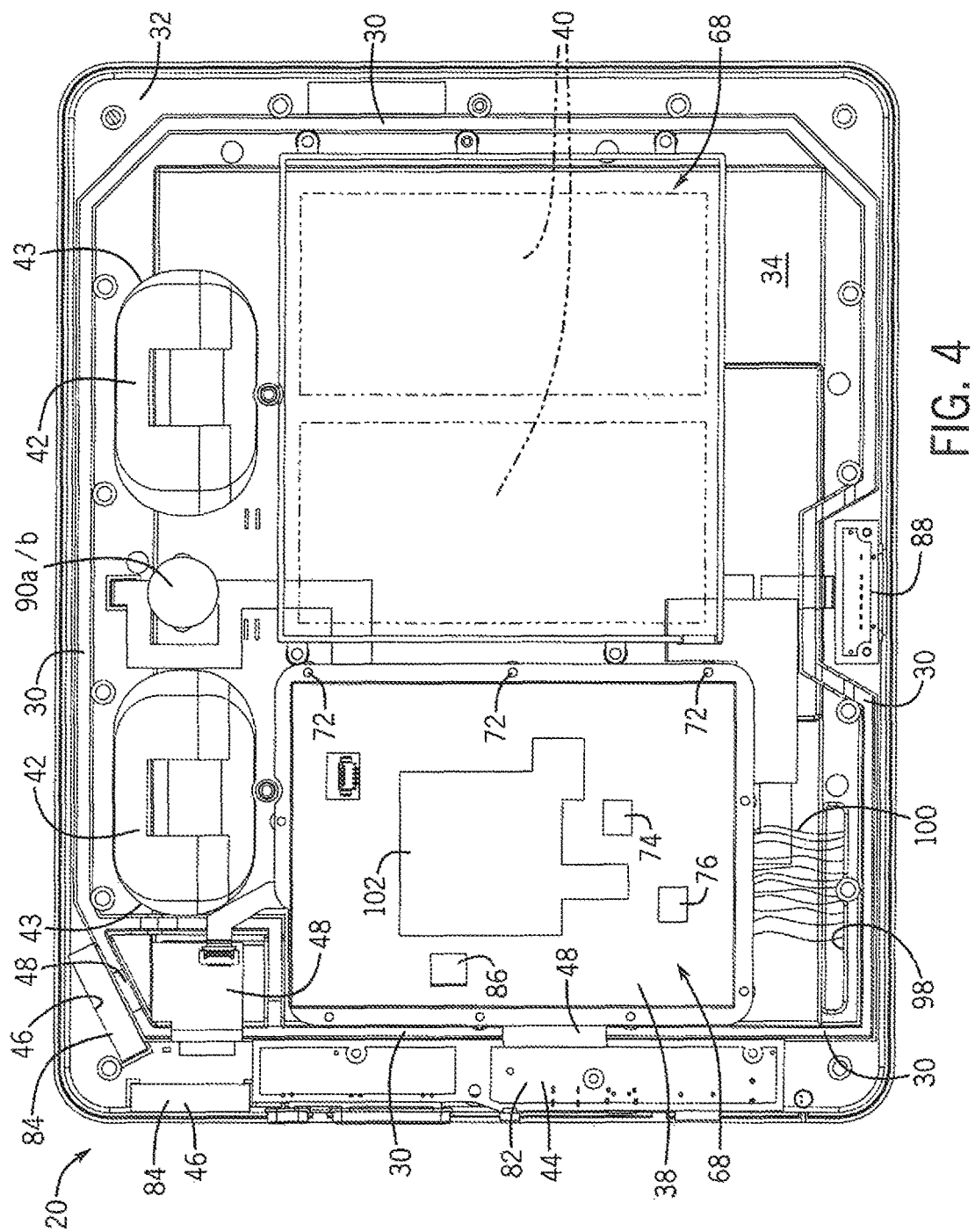
FIG. 4 is a bottom plan view of an electronics layer of the tablet of FIG. 1.

The illustrated tablet computer 10 provides a housing 12 enclosing the internal components of the tablet computer 10 within a generally rigid outer body. The housing 12 provides a front cover 14 joined to a rear cover 16 at their respective peripheries. As illustrated, the rear cover 16 is formed from a single member and defines the rear of the housing 12. An exterior surface of the rear cover 16 may include mounting holes 58 for mounting the tablet 10 in a fixed position, and includes a camera lens opening 61 for the rear camera 92 and audio speaker holes or a grille 62. The rear cover 16 may be beveled outward from the periphery of the housing 12 to a central portion of the rear cover 16 to provide an additional space 64 within an inner surface of the rear cover 16 to receive electrical circuitry 68, as shown in FIG. 4. The front cover 14 is an aesthetic molding forming a frame or bezel encircling a rectangular opening 66 holding the touch screen interface 28 in position. The front cover 14 includes a camera lens opening 60 for the front camera 90. It is understood that the housing may vary depending on the type of wireless mobile computing device being used.

Figure 3:
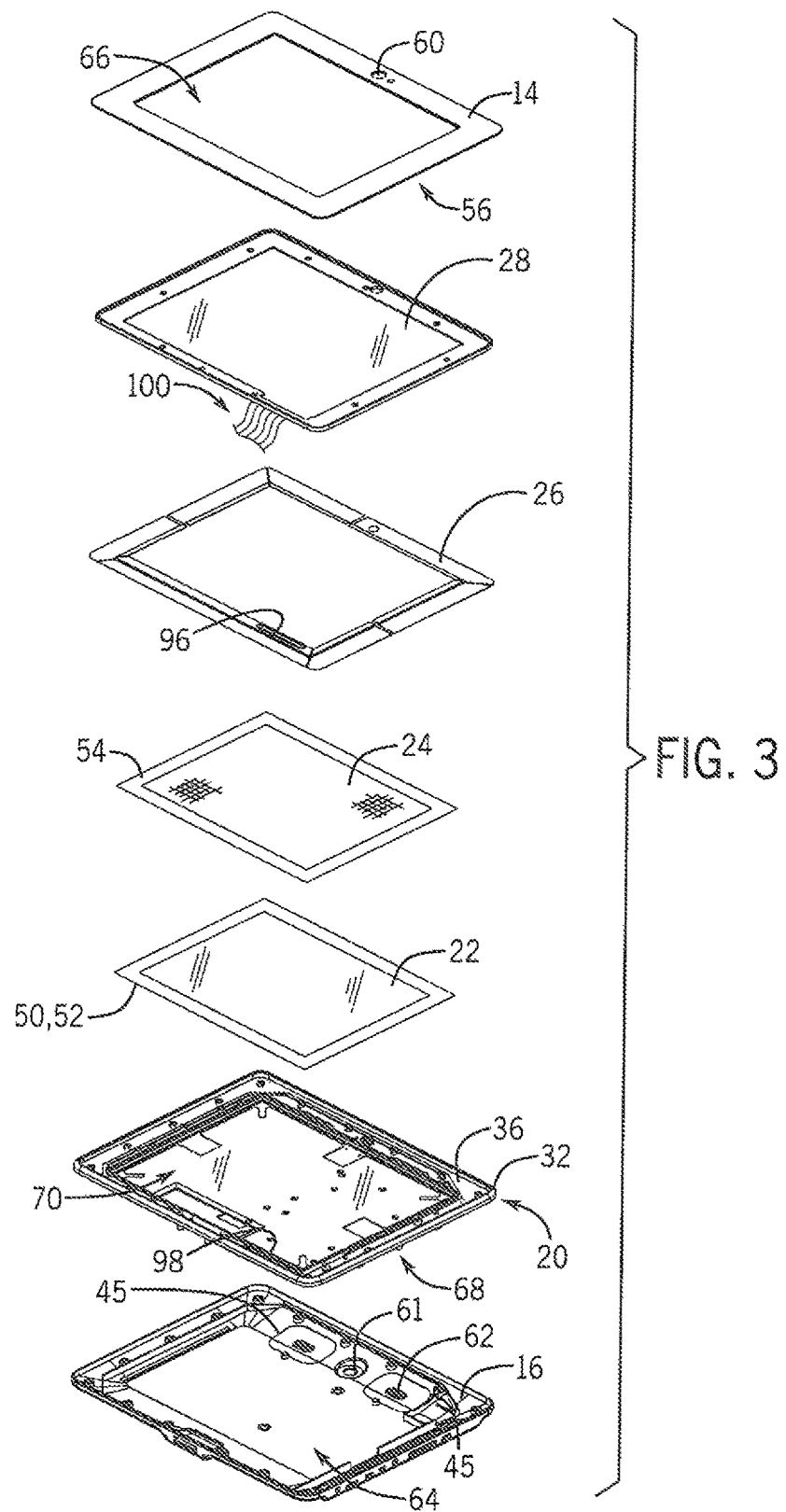
FIG. 3 is an exploded view of the layered components of the tablet of FIG. 1.

Referring next to FIG. 3, enclosed within the housing 12 are a number of layers forming sub-compartments, or cavities, within the housing 12. Starting at the rear cover 16 and moving forward toward the front cover 14 are the following layered components: an electronics layer 20, a LCD panel 22, a LCD shield 24, a conductive frame 26, and a touch screen interface 28. The layered components are substantially enclosed within the housing 12 by the front cover 14 and rear cover 16. FIGS. 5 through 9 further show the assembly of the tablet computer 10 by the addition of layers starting with the electronics layer 20 inserted in the rear cover 16 and moving toward the front cover 14. At least a portion of the layers are made from a shielding material, and the types of layered components and the order and number of layers within the housing 12 may vary and define separate "Faraday cages" within the housing 12. The order and arrangement of individual layers may vary while maintaining the desired shielding without departing from the spirit of the invention.

The sub-compartments, or cavities, within the tablet 10 are formed by the layers that serve as "Faraday cages" shielding the interior of the sub-compartments, or cavities, of the tablet computer 10. The Faraday cage is formed, at least in part, with a conductive material, such as a conductive mesh material. The electrical field generated by the dynamic magnetic field generated within the MRI scanner induces a current within the conductive material of the Faraday cage. The current flows within the shield layer inside the enclosure. This distribution of the induced current minimizes or cancels the fields that would have otherwise existed on the inside of the enclosure. The induced currents are known as eddy currents. Similarly, electronic components within the Faraday cage may emit electromagnetic radiation that induces eddy currents within the conductive material of the Faraday cage. The eddy currents occur on the inner surface of the Faraday cage for the electromagnetic radiation generated within the Faraday cage and on the outer surface of the Faraday cage for the electric field generated by the dynamic magnetic field of the MRI scanner outside the Faraday cage. Thus, internal magnetic fields stay inside the enclosure and external magnetic fields stay outside the enclosure.

The rear cover 16 may be formed of a conductive material such as a metal or, alternatively, of a plastic material coated with metallic ink or similar conductive material. The ink may consist of a carrier material loaded with a suitable metal, such as silver, copper or nickel, in the form of very small particulates. It is sprayed on to the housing 12 and, once dry, produces a continuous conductive layer of metal, thus providing effective electromagnetic shielding. In one embodiment, the rear cover 16 may be constructed of glass filled virgin polycarbonate and further metalized by a silver ink.

The rear cover 16 and a metal coated plate 32 of the electronics layer 20 form a first Faraday cage within which electrical circuitry 68 for the tablet computer 10 is mounted to the rear of the plate 32. The metal coated plate 32 of the electronics layer 20 and an LCD shield 24 form a second Faraday cage within which the LCD panel 22 is mounted. A conductive frame 26 may provide a continuous electrical connection between the electronics layer 20 and LCD shield 24. The conductive touch screen interface 28 may be held in place by the front cover 14.

Figure 5:
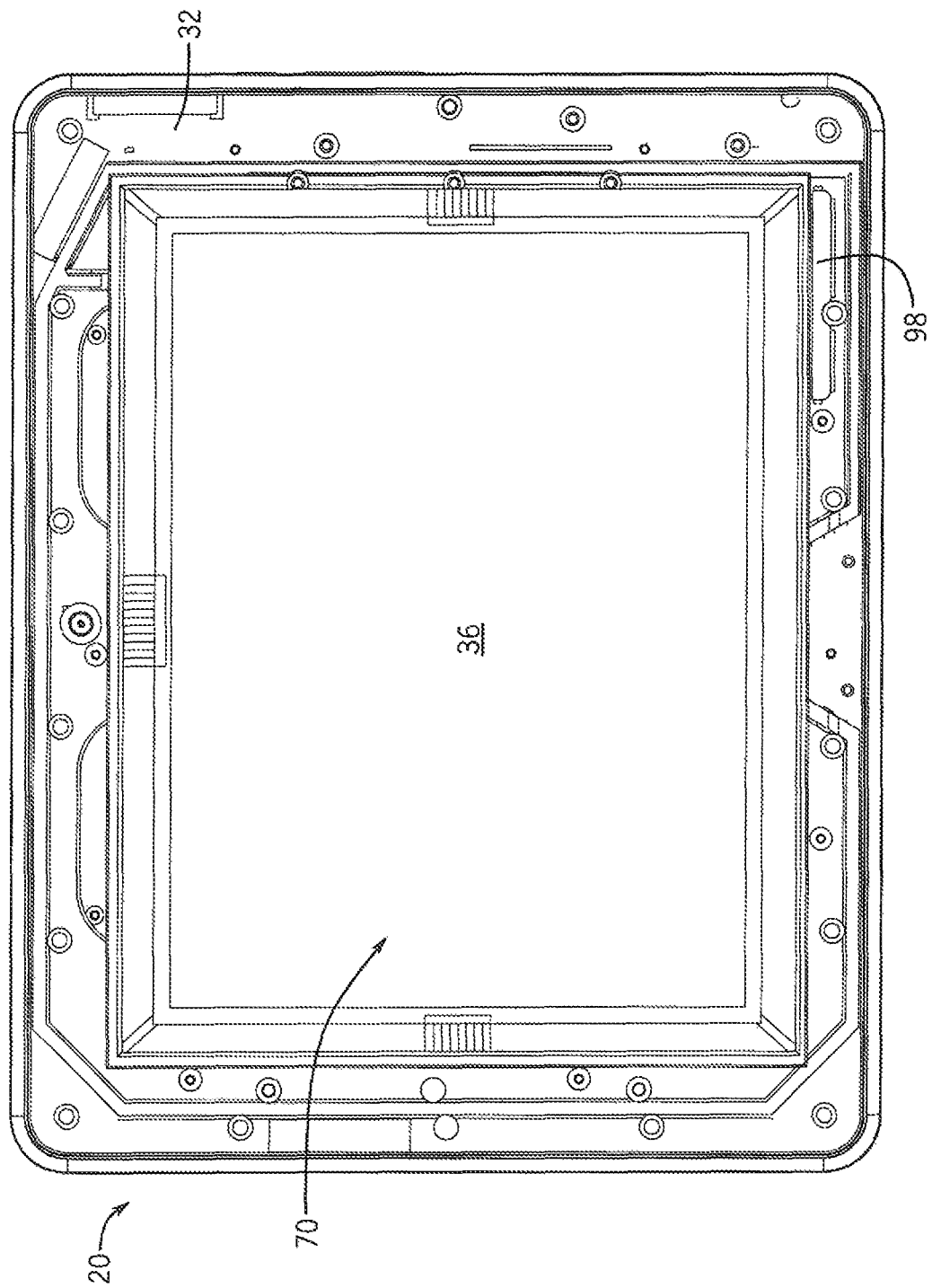
FIG. 5 is a top plan view of the electronics layer shown installed within 4a rear cover of the tablet of FIG. 1.

Referring to FIGS. 4 and 5, a first layer held adjacent to the rear cover 16 is an electronics layer 20. The electronics layer 20 includes the metal coated plate 32 having a bottom metalized surface 34 and a top metalized surface 36 opposite the bottom metalized surface. When the electronics layer 20 is mounted within the housing, the bottom metalized surface 34 is oriented toward an inner surface of the rear cover 16. As shown in FIG. 4, the bottom metalized surface 34 carries electrical circuitry 68 including a number of electronic components such as a printed circuit board 38, battery pack 40, and speakers 42 held within a conductive gasket 30. An interface board 44 and antennas 46 are held outside the conductive gasket 30. The top metalized surface 36 provides a recess 70 allowing reception of the LCD panel 22, to be further described below.

According to one embodiment of the invention, the metal coated plate 32 may be a plastic plate coated with a metallic coating or with a carrier material containing a suitable metal as described above. The surfaces 34, 36 of the plate 32 are sprayed with a silver ink to provide a conductive layer over each surface. The metal coated plate 32 is sized similar to but slightly smaller than the rear cover 16 so that the electronics layer 20 may fit within the perimeter of the rear cover 16. The space 64 formed by the beveled rear cover 16 also allows the electrical circuitry 68 to fit within the rear cover 16 without interference.

The electronic components utilized for the electrical circuitry 68 are selected and arranged to reduce or eliminate interaction both by the electrical circuitry 68 with the main magnetic field ($B_o$) of the MRI scanner and by the magnetic field of the MRI scanner with the electrical circuitry. To reduce or eliminate interaction by the electrical circuitry 68 with the magnetic field of the MRI scanner, the electronic components are selected to remove magnetic materials, such as iron, nickel, cobalt, manganese and other magnetic material which may cause the homogeneity of the MRI scan to be distorted.

"Magnetic materials" are classified as having a high magnetic permeability ($K_m>1$). In general, it is desired for magnetic materials to be replaced with non-magnetic materials with a constant relative permeability of one ($K_m=1$). It is also desired to remove ferromagnetic materials, characterized as having a saturation property, i.e., state reached when the magnetic flux density B levels off. The ferromagnetic materials are replaced with non-ferric, non-magnetic materials.

One component of the electrical circuitry 68 may be a printed circuit board 38 held on the bottom metalized surface 34 of the metal coated plate 32. The printed circuit board 38 includes a processor 102 executing a program stored in memory 86. The memory 86 may store a program for operating the operating system or applications. The tablet computer 10 may run an Android®, Windows®, Apple®, Linux®, or a hybrid operating system. Programs may be run on the tablet computer 10 including a mobile web browser, e-book readers, media players, video conferencing, and other programs for games, education and utilities.

The printed circuit board 38 is particularly susceptible to electromagnetic interference and is modified to remove ferric materials. For example, transformers and inductors with ferrite cores are replaced with non-ferrous materials. Fasteners 72 securing the printed circuit board 38 to the plate 32 may be made of brass, aluminum, titanium, or copper rather than steel. The electronic components are arranged on the printed circuit board 38 to reduce potential side effects detrimental to the MRI scanner or the tablet computer 10. The electronic components are located in close proximity to other components to which they are electrically connected, reducing the length of traces or wire runs between the components, thereby reducing the potential for heating due to currents induced on those traces or wire runs by the MRI scanner. The electronic components are also arranged to minimize the formation of loops, which are susceptible to coupling with the magnetic field from the MRI scanner.

Another component of the electrical circuitry 68 may be a battery pack 40 also held on the bottom metalized surface 34 of the metal coated plate 32 for powering the device. The battery pack 40 is electrically connected to a battery monitor circuit 74 of the printed circuit board 38. The battery monitor circuit 74 measures the voltage or current level of the battery pack 40 to determine performance and/or expected remaining life of the battery pack 40. The battery monitor circuit 74 generates a signal if the voltage or current level drops below a predetermined threshold to indicate, for example, low remaining charge of the battery pack 40 and may provide a visual indication on the LCD panel 22.

The battery is also susceptible to electromagnetic interference. When the MR scanner is used, eddy currents are induced in the batteries creating two undesired phenomena: unwanted time-varying gradients and shifts in the main magnetic field ($B_o$). The battery pack 40 may be replaced with a non-ferrous battery pack, such as one or more lithium polymer batteries. The electromagnetic interference within the batteries may also be reduced by using multiple batteries having a smaller surface area than a single battery. The eddy currents induced in each battery circulate within the battery. Consequently, utilizing a battery pack with multiple batteries of smaller surface area results in multiple separate eddy currents each having a smaller amplitude than an eddy current which would be induced in a single large battery. The total effects of the eddy currents are reduced by creating multiple smaller eddy currents instead of one large eddy current.

Another component of the electrical circuitry 68 may be speakers 42 held on the bottom metalized surface 34 for delivering audio signals to the user through the audio speaker holes 62 formed within the rear cover 16. The speakers 42 are surrounded by a generally oval wall 43. The wall 43 is received by a mating oval trough 45 on the rear cover 16. The wall 43 and trough 45 form a sealed speaker chamber to provide a shielded sound chamber for the audible sound of the speakers 42 to resonate. The holes 62 may be taped over with conductive tape to maintain the shielding integrity of the shielded sound chamber and the first shielded cavity. The speakers 42 may be piezoelectric material found within a casing. Each speaker 42 receives a sound signal represented, for example, as a voltage signal. When the voltage signal is delivered to the piezoelectric material, it is converted to an audible sound using the diaphragms and resonators of the speaker 42, as understood in the art.

The speakers 42 are electrically connected to a wireless audio module 76. The wireless audio module 76 is configured to receive a wireless audio signal. It is contemplated that the wireless audio signal may be delivered wirelessly from a transmitting device (not shown) located in the MRI environment or in an adjacent control room that is insulated from the magnetic environment. The wireless audio signal may use radio frequency (RF) waves transmitted from the RF transmitting device to an RF receiver. The RF receiver device includes one or more antennas 46 to receive the RF waves and the wireless audio signals are communicated to the wireless audio module 76. The wireless audio module has a receive circuit operable to convert the RF signal to a digital signal suitable, for example, as an input to the processor 102 in communication with the receive circuit. The processor 102 converts the received audio signal to an output signal, which may be provided directly or through a driver circuit to the piezoelectric speaker such that the speaker 42 may reproduce the original audible signal for the patient. Optionally, the wireless audio module 76 may be configured to directly convert the wireless audio signal to the voltage signal for the piezoelectric speaker which is, in turn, converted by the speaker to an audible signal output to the patient.

The RF waves are generally selected at a frequency higher than the operating frequency of the MRI scanner such that the sound signals do not interfere with the MRI signals. However, RF filters may be used to filter out any interfering signals. The speaker may be as further described in "Method and Apparatus for Delivering Audio Signals and Providing Hearing Protection During Medical Imaging", U.S. application Ser. No. 14/952,575, hereby incorporated by reference.

Other electrical circuitry 68 may be connected to the printed circuit board, such as a front and back facing camera(s) 90, 92 for photography and video. The camera(s) 90, 92 may be a 5-megapixel integrated camera. There may also be a microphone 104 for receiving an audio input signal, such as the patient's voice.

The electromagnetic shielding may be included on a portion of or on the entire printed circuit board 38 to reduce the interaction between the MRI scanner and the circuit board 38. In one embodiment, a conductive gasket 30 encircles the shielded elements—the printed circuit board 38, battery pack 40, and speakers 42—to seal the junction between the surfaces formed by the bottom metalized surface 34 of the metal coated plate 32 and the inner surface of the rear cover 16 to create an electromagnetic seal. As such, the electronic components on the bottom surface 34 of the coated plate 32 are sealed within the first shielded cavity formed by the metal coated plate 32 of the electronics layer 20 and the rear cover 16. The conductive gasket 30 may be made out of a conductive material, such as conductive foam or conductive yarn, and be adhesive backed to adhere to the bottom metalized surface 34 of the metal coated plate 32. It is understood that the electromagnetic shielding may be applied to any desired elements of the tablet computer 10. The types of elements, number and arrangement of those elements may vary without departing from the spirit of the invention. It is understood that elements held outside the shielded area may require communications (e.g., RF transmission, physical connections) which may not be permitted within the shielded area. An example of the types of elements held outside the shielded area is further described below.

A number of elements are mounted on the bottom metalized surface 34 but held outside the conductive gasket 30 to allow external communication, such as RF transmission to those elements. For example, an interface board 44 and an antenna 46 are illustrated as being mounted to the bottom surface 34 of the coated plate 32 but located external to the loop formed by the conductive gasket 30. The antenna 46 may transmit and/or receive RF signals with devices outside the device. The interface board 44 may include, for example, a power button 47, volume controls 49, or ports 51 to establish external connections or receive removable storage media. Cables 48 may extend from the interface board 44 and antenna 46 to the printed circuit board 38 in order to allow the processor 102 to communicate with and control operation of the interface board 44 and the antenna 46. In order to prevent RF interference with the MRI, the cables 48 extending between the printed circuit board 38 and the interface board 44 and/or antennas 46 may be shielded and the signals conducted by the cables 48 may be filtered. The cables 48 may be formed with an external wire mesh shield surrounding an inner core conductor. The shielding impedes the transmission of signals desired to be conducted by the core conductor outside of the tablet computer 10 and also impedes the reception of undesired signals from outside the tablet computer 10 onto the core conductor. Copper tape may be used to reinforce the shielding of the cables 48.

Signals to be transmitted from the tablet computer 10 may be filtered prior to transmission. The processor 102 may generate data packets for wireless communications and those data packets are transmitted to a transmitter or transceiver circuit configured to convert the digital signal to an analog signal of the desired frequency for transmission. As discussed herein, the desired frequency may be, for example, a 2.4 GHz or greater transmission frequency to avoid interference in with the operating frequencies of the MR scanner. However, certain elements of the conversion circuit, such as the clock frequency, may be present at a frequency other than the transmission frequency and that may interfere with the MR scanner. Consequently, a filter may be included on the signal line and in series with the cable 48 extending between the shielded volume and the antenna 46. The filter may be included either within the shielded volume or at the interface between the shield and the unshielded volume of the tablet computer 10. It is further contemplated that similar filters may be included on any signal passing from a shielded volume either to another shielded volume or to an unshielded volume within the tablet computer 10 to reduce or eliminate undesirable transmission of signals that may interfere with the MR scanner.

The interface board 44 may include ports and switches for data communication with an external source such as audio, HDMI, USB, charging, docking station, on/off, volume, and an SD card slot. The interface board 44, thus, must connect with an exterior of the housing 12 and cannot be sealed within the electromagnetic shielded area. An integrated RF filter 82 may be added to the interface board 44 to filter outgoing frequencies which would interfere with MRI frequencies, which is typically at 64 MHz and 128 MHz and magnetic field strengths at, for example, 1.5T or 3T. The filter 82 may also filter incoming frequencies which would interfere with the audio frequencies at or below 20 kHz.

The antennas 46 receive and/or transmit wireless signals from an external transmitter/receiver (not shown). The wireless signals received by the antennas 46 may be any suitable wireless communication standard, for example, Bluetooth or IEEE 802.11. Typically, frequencies similar to the MRI frequencies would interfere with the MRI scanner, causing noise and zipper artifacts that interfere with the MRI signal. The antennas 46 are, therefore, configured to operate above the operating frequencies of the MRI scanner, for example, at a frequency of 2.4 or 2.5 GHz. Optionally, any high frequency which does not interfere with the operation of the MRI scanner may be selected. An integrated RF filter 84 may be added to the antennas to filter outgoing frequencies which would interfere with the MRI frequencies at 64 MHz and 128 MHz. The filter 84 may also filter incoming frequencies which would interfere with the antenna frequencies at 2.4 or 2.5 GHz.

The antennas 46 may be used to receive wireless data, such as audio or visual data signals to be shown on the LCD panel 22, translated through the speakers 42, or used by other software running on the tablet. The antennas 46 may be used in connection with wireless headphones such as those described in "MRI Compatible Headset", U.S. application Ser. No. 13/491,650, hereby incorporated by reference.

As used herein, a "wireless" signal is an electromagnetic wave signal transmitted from a transmitter to a receiver where the transmitter and/or receiver may be discrete electronic components, a portion of a transceiver, or a portion of another module, which includes other features, for example, processing of the electromagnetic wave signals and any required supporting electronic circuitry.

Other elements held outside of the conductive gasket 30 include a docking port 88 for mounting the tablet computer 10 and charging the battery pack 40.

The top metalized surface 36 on the metal coated plate 32 of the electronics layer 20 and the LCD shield 24 form the second shielded cavity. Referring to FIG. 5, the top metalized surface 36 of the metal coated plate 32 provides a recess 70 allowing insertion of the LCD panel 22 therein. The recess 70 is smaller than the top metalized surface 36 and substantially the same size as the LCD panel 22. The recess 70 is configured to receive the LCD panel 22 and align the LCD panel with the opening 66 in the front cover 14. The recess 70 is inset in the top metalized surface 36 so that a border of the top metalized surface 36 may provide a contacting surface for the conductive frame 26 as will be further described below.

Figure 6:
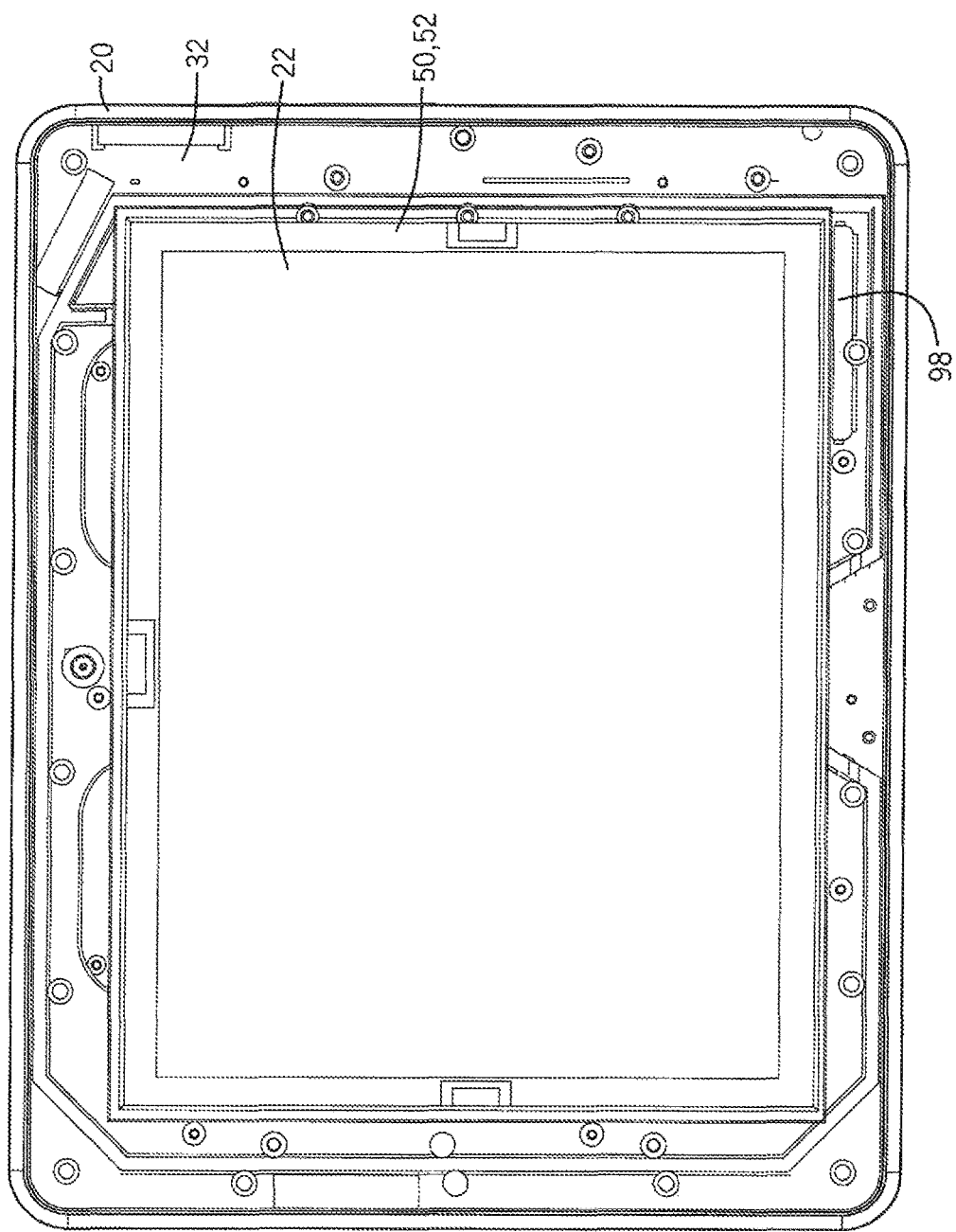
FIG. 6 is a top plan view of a Liquid Crystal Display (LCD) panel installed within a recess of the electronics layer of FIG. 5.

Referring to FIG. 6, the LCD panel 22 is shown installed within the recess 70 of the top metalized surface 36. According to one embodiment, the LCD panel 22 may be about a 9.7-inch LCD screen. It is contemplated that various other sizes of LCD panels and/or other types of display panels may be utilized without deviating from the scope of the invention. The LCD panel 22 is located within the recess 70 of the top metalized surface 36 of the metal coated plate 32 and may be bordered by a conductive gasket material 50 and/or copper foil 52. The conductive gasket material 50 and/or copper foil 52 extends around the periphery of the LCD panel 22. It is further contemplated that the conductive gasket material 50 and/or copper foil 52 extends up to the top surface of the LCD panel 22 and, optionally, may be positioned over and/or around the periphery of the top surface of the LCD panel 22. The conductive gasket material 50 and/or copper foil 52 also contacts the top metalized surface 36 of the metal coated plate 32 when the LCD panel 22 is installed defining a conductive path between the top metalized surface 36 of the coated plate and the upper periphery of the LCD panel 22.

Figure 7:
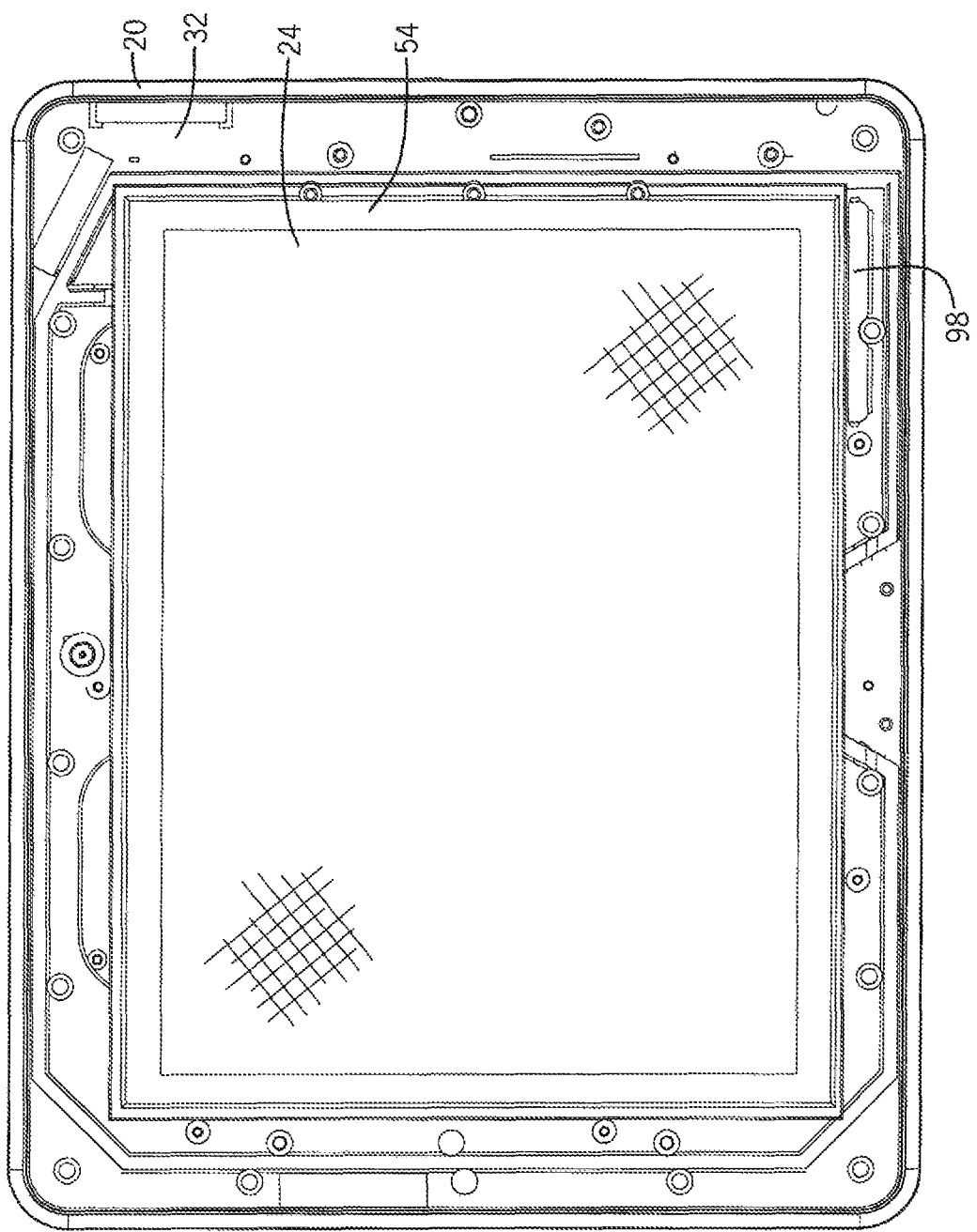
FIG. 7 is a top plan view of an LCD shield installed over the LCD panel of FIG. 6.

The LCD panel 22 may generate electromagnetic emissions at a frequency that could degrade performance of the MRI scanner and, therefore, it is desirable that the display be shielded to prevent such emissions. Referring to FIG. 7, the LCD shield 24 may be placed over the LCD panel 22 and define, in part, the second shielded cavity located around the LCD panel 22. The second shielded cavity reduces or eliminates the electromagnetic emissions from the LCD panel 22. The LCD shield 24 may be a wire-mesh shield or otherwise conductive film screen that is substantially transparent, allowing visible light with wavelengths ranging between 400 nm and 700 nm to pass through the screen, yet blocking RF transmissions having longer wavelengths from radiating out or from entering the device. In one embodiment, a wire-mesh shield may be a conductive optical grid embedded in glass or plastic substrate such as acrylic, polycarbonate or polyester (PET) or triacetate (TAC). It may provide about 100 openings per inch, providing openings that are significantly smaller than the wavelength of the undesired high frequency emissions from the LCD panel 22 and similarly smaller than the wavelength of radiation generated by the MRI scanner. The mesh is intended to approximate an unbroken conducting surface to the longer wavelengths to be filtered such that the radiation at the frequencies of interest are conducted by rather than passing through the mesh. In contrast, the majority of the visible light with the shorter wavelengths passes through the openings and is viewable by a user of the device. It is understood that the mesh may be improved by utilizing smaller holes. Other LCD shields 24 include transparent conductive oxides such as indium tin oxide (ITO) and metals such as gold or silver which are deposited onto optical substrates such as glass, acrylic, polycarbonate and allyl diglycol carbonate (ADC). According to still other embodiments of the invention, the LCD shield 24 may be made of a transparent, flexible film with a shielding material, such as silver or ITO deposited on one side of the film.

The LCD shield 24 is transparent within a viewing region but may also include a conductive bus bar 54 extending around the perimeter of the LCD shield. The conductive bus bar 54 may be, for example, a conductive metallic strip, such as a foil or tape made from gold or copper. Optionally, the bus bar 54 may be an extended mesh material or conductive gasket connected or adhered to the LCD shield. The bus bar 54 is in contact with the metallic mesh, conductive oxide, or other shielding material deposited on the transparent, viewing region of the LCD shield 24 to define a substantially unbroken conductive layer with respect to the undesired electromagnetic emissions generated by the LCD panel 22 and/or radiation generated by the MRI scanner. The bus bar 54 is also positioned to contact the conductive gasket material 50 and/or copper foil 52 positioned around the periphery of the LCD panel 22. Thus, the LCD shield 24, bus bar 54, conductive gasket material 50 and/or copper foil 52, and the top metalized surface 36 of the metal coated plate 32 define a second shielded cavity around the LCD panel 22.

Figure 8:
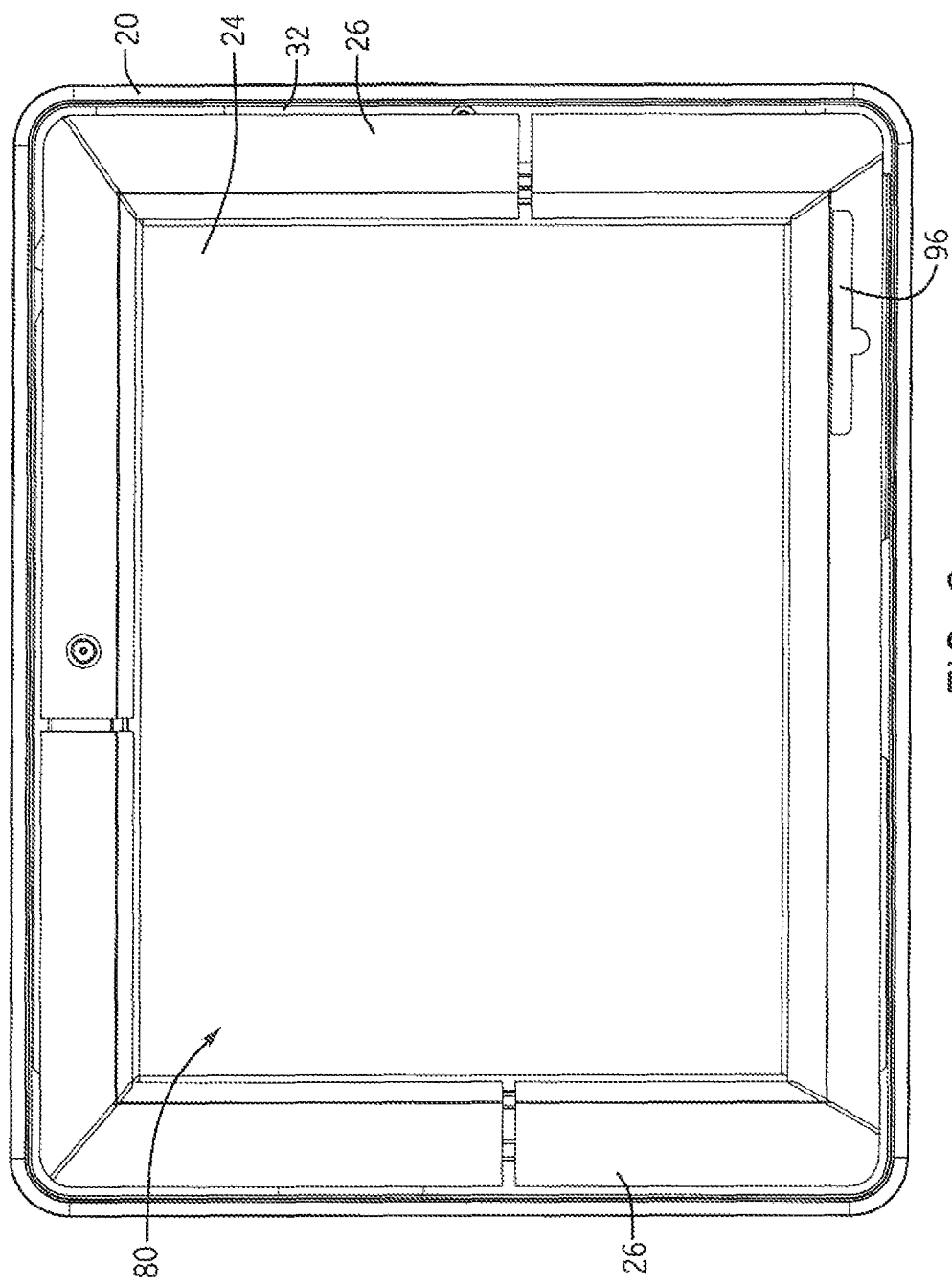
FIG. 8 is a top plan view of a frame installed over the LCD shield of FIG. 7.

A conductive frame 26 is positioned over the LCD shield 24 to help retain the layers in position and to establish an electrical connection between the first and second shielded cavities. Referring next to FIG. 8, the conductive frame 26 provides a bezel with a rectangular opening 80 revealing the LCD shield 24 and LCD panel 22. The outer periphery of the conductive frame 26 is generally sized to correspond with the outer periphery of the metal coated plate 32 so that the border formed by the top metalized surface 36 and the conductive frame 26 may contact. The periphery of the rectangular opening 80 is generally sized to correspond to the viewing area of the LCD panel 22 such that images displayed by the LCD panel 22 are visible through the opening 80. The conductive frame 26 overlaps the bus bar 54 of the LCD shield 24, the conductive gasket material 50 and/or copper foil 52 extending around the periphery of the LCD panel 22, and the top metalized surface 36 of the metal coated plate 32 to establish electrical connections therebetween. When the front cover 14 is secured to the rear cover 16, the conductive frame 26 compress the bus bars 54 of the LCD shield 24 against the conductive gasket material 50 and/or copper foil 52 extending around the periphery of the LCD panel 22 and further compress the conductive gasket material 50 and/or copper foil 52 against the metal coated plate 32. The connection of the LCD shield 24, conductive gasket material 50 and/or copper foil 52 around the LCD panel 22, and the metal coated plate 32 provides a continuous conductive connection so as to create the second shielded cavity with respect to the LCD panel 22. It is understood that compression of the LCD shield 24 to the conductive gasket material 50 and/or copper foil 52 around the LCD panel 22 and further to the metal coated plate 32 may also be achieved by taping down, or otherwise holding the LCD shield 24 against the metal coated plate 32, instead of using the conductive frame 26.

Referring next to FIG. 9, a touch screen interface 28 may be positioned over the conductive frame 26 and LCD shield 24. The touch screen interface 28 may be an indium tin oxide (ITO) touch screen which is a transparent conductor. The touch screen interface 28 may be a resistive or capacitive touch screen responsive to pressure input on the screen, for example, from a stylus pen or finger tip. The touch screen interface 28 allows the user to navigate easily and type with a virtual keyboard shown on the LCD display panel 22.

The touch screen interface 28 may be bordered by an opaque trim 94. The touch screen interface 28 communicates with the printed circuit board via a ribbon cable 100 extending from the rear of the touch screen interface 28 through a first hole 96 formed in the conductive frame 26 and a through a second hole 98 formed in the metal coated plate 32 to connect to the printed circuit board 38. The ribbon cable 100 may be shielded by a wire mesh and/or copper tape wrapped around the cable. The space within the holes 96, 98 may be filled with a shielding gasket surrounding the ribbon cable 100 to prevent the transmission of radiation emanating into and out of the first shielded cavity. The touch screen interface 28 may also be covered by a conductive film (not shown) or other conductive material to further shield the touch screen interface 28 from the outside MRI environment while still permitting touch sensitivity to the screen. The conductive film or other conductive material may contact the conductive frame 26 or outer periphery of the top metallized surface 36 of the metal coated plate 32 establishing an electrical connection therebetween. The additional conductive film, in conjunction with the LCD shield would define a third shielded cavity, or a third Faraday cage, around the touch screen interface 28. Referring again to FIG. 1 and FIG. 3, the touch screen interface 28 is enclosed by an outer edge of the front cover 14 to hold the touch screen interface 28 in place and to define, along with the front cover 14 and the rear cover 16, the housing 12 of the tablet computer 10.

While the tablet computer 10 is described as having a first shielded cavity and a second shielded cavity, the tablet computer 10 may have any number of shielded cavities formed by the joining of conductive layers to form electromagnetic shielded volumes therein. For example, the tablet computer 10 may include one, two, three, four, of more shielded cavities, each forming a separate "Faraday cage" to shield internal elements from electromagnetic activity. The forming of the shielded cavities described above may be applied to any of the layers of the tablet computer 10. For example, any combination of metal coated plates, metal plates, conductive gasket material, conductive films, conductive coatings, conductive screens/shields, and the like may be used to form the shielded cavities. The conductive gasket material may be used to help separate certain elements held inside the shielded area from elements held outside the shielded area and to surround electrical conductors passing between the shielded and unshielded areas.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom," "left," "right," and "side" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a controller" and "a processor" should be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, are hereby incorporated herein by reference in their entireties.

We claim:

1. A mobile computer for use in a Magnetic Resonance Imaging (MRI) environment during a MRI scan, the mobile computer comprising:
    a housing having an opening;
    a display visible through the opening in the housing;
    a user interface operative to generate a signal corresponding to a desired operation of the mobile computer;
    a printed circuit board including a memory device and a processor in communication with the memory device, wherein the processor receives the signal from the user interface; and at least two shielded cavities within the housing, wherein the at least two shielded cavities include:
- a first non-ferrous, conductive surface having a first outer periphery,
- a second non-ferrous, conductive surface having a second outer periphery, and
- a plate mounted within the housing between the first non-ferrous conductive surface and the second non-ferrous conductive surface,
- a first conductive material positioned between the first non-ferrous, conductive surface and the plate defining a first shielded cavity, and
- a second conductive material positioned between the second non-ferrous conductive surface and the plate defining a second shielded cavity, wherein:
  - the printed circuit board is located in the first shielded cavity, and
  - the display is located in the second shielded cavity.

2. The mobile computer of claim 1 wherein:
the housing includes a front cover and a rear cover,
the rear cover includes the first non-ferrous, conductive surface of the first shielded cavity,
the plate has a first metallic surface,
the printed circuit board is mounted to the first metallic surface of the plate, and
the plate is mounted within the housing such that the first metallic surface of the plate faces the rear cover.

3. The mobile computer of claim 2 wherein:
the plate has a second metallic surface opposite the first metallic surface,
the display is mounted adjacent to the second metallic surface of the plate,
the mobile computer further comprises a display shield configured to be positioned over a viewing surface of the display,
the display shield includes a conductive material disposed therein and configured to extend over the viewing surface of the display, and
the second non-ferrous, conductive surface of the second shielded cavity is defined by the conductive material of the display shield.

4. The mobile computer of claim 3 wherein the plate includes a recess in which the display is positioned and the second conductive material extends between the second metallic surface of the plate and the display shield.

5. The mobile computer of claim 3 wherein:
the user interface is a touchscreen interface positioned on the display outside of the second shielded cavity, and
a shielded cable extends between the user interface and the printed circuit board in the first shielded cavity.

6. The mobile computer of claim 5 further comprising a conductive film positioned over the touchscreen interface, wherein an outer periphery of the conductive film is in contact with an outer periphery of the conductive material of the display shield defining a third shielded cavity around the touchscreen interface.

7. The mobile computer of claim 1 further comprising:
an antenna mounted within the housing external to the at least two shielded cavities, and
a shielded cable extends between the antenna and the printed circuit board in the first shielded cavity.

8. The mobile computer of claim 1 further comprising a battery pack located within the at least two shielded cavities, the battery pack including a plurality of batteries.

9. A mobile computer for use in a Magnetic Resonance Imaging (MRI) environment during a MRI scan, the mobile computer comprising:
a housing having an opening;
a display visible through the opening in the housing;
a printed circuit board including a memory device and a processor in communication with the memory device;
a first shielded cavity, including:
- a first non-ferrous conductive surface, and
- a second non-ferrous conductive surface, wherein:
  - the first shielded cavity is defined by a volume contained between the first and the second non-ferrous conductive surfaces, and
  - the printed circuit board is mounted within the first shielded cavity;
a second shielded cavity, including:
- a third non-ferrous conductive surface, and
- a fourth non-ferrous conductive surface, wherein:
  - the second shielded cavity is defined by a volume contained between the third and the fourth non-ferrous conductive surfaces, and
  - the display is mounted within the second shielded cavity;
a first conductive material positioned between the first non-ferrous conductive surface and the second non-ferrous conductive surface, wherein the first shielded cavity is defined by the volume contained between the first non-ferrous conductive surface, the second non-ferrous conductive surface, and the first conductive material; and
a second conductive material positioned between the third non-ferrous conductive surface and the fourth non-ferrous conductive surface, wherein the second shielded cavity is defined by the volume contained between the third non-ferrous conductive surface, the fourth non-ferrous conductive surface, and the second conductive material.

10. The mobile computer of claim 9 wherein the first conductive material is a first conductive gasket.

11. The mobile computer of claim 10 wherein the second conductive material is a second conductive gasket.

12. The mobile computer of claim 9 wherein the second non-ferrous conductive surface is the same as the third non-ferrous conductive surface.

13. The mobile computer of claim 9 further comprising a plate inserted within the housing, the plate including a first conductive surface and a second conductive surface, wherein:
the second conductive surface is opposite the first conductive surface,
the first conductive surface of the plate defines the second non-ferrous conductive surface, and
the second conductive surface of the plate defines the third non-ferrous conductive surface.

14. The mobile computer of claim 9 further comprising:
a touchscreen interface positioned on the fourth non-ferrous conductive surface outside of the second shielded cavity and aligned with the display inside the second shielded cavity, and
a shielded cable extending between the touchscreen interface and the printed circuit board in the first shielded cavity.

15. The mobile computer of claim 14 further comprising a conductive film positioned over the touchscreen interface, wherein the conductive film and the fourth non-ferrous conductive surface define a third shielded cavity around the touchscreen interface.

16. The mobile computer of claim 9 further comprising:
an antenna mounted within the housing external to the first and second shielded cavities, and a shielded cable extending between the antenna and the printed circuit board in the first shielded cavity.

17. The mobile computer of claim 9 further comprising a battery pack located within the first shielded cavity, the battery pack including a plurality of batteries.

18. A mobile computer for use in a Magnetic Resonance Imaging (MRI) environment during a MRI scan, the mobile computer comprising:
- a housing having an opening, wherein a first shielded cavity and a second shielded cavity are defined within the housing;
- a display located in the second shielded cavity and visible through the opening in the housing;
- a user interface operative to generate a signal corresponding to a desired operation of the mobile computer;
- a printed circuit board located in the first shielded cavity, the printed circuit board including a memory device and a processor in communication with the memory device, wherein the processor receives the signal from the user interface;
- a means for preventing interference between an MRI scanner conducting the MRI scan and the display in the second shielded cavity; and
- a means for preventing interference between the MRI scanner and the printed circuit board in the first shielded cavity.

19. The mobile computer of claim 18 wherein a third shielded cavity is defined within the housing, the user interface is a touchscreen interface located in the third shielded cavity, and the mobile computer further comprises a means for preventing interference between the MRI scanner and the touchscreen interface in the third shielded cavity.

* * * * *